United States Patent [19]

Kokta

[11] Patent Number: 4,836,953
[45] Date of Patent: Jun. 6, 1989

[54] PROCESSES FOR ENHANCING FLUORESCENCE OF TI:A1203 TUNABLE LASER CRYSTALS

[75] Inventor: Milan R. Kokta, Washougal, Wash.

[73] Assignee: Union Carbide Corporation, Danbury, Conn.

[21] Appl. No.: 154,033

[22] Filed: Feb. 9, 1988

[51] Int. Cl.⁴ .............................................. C09K 11/36
[52] U.S. Cl. ...................... 252/301.4 F; 252/301.4 R; 156/606; 156/DIG. 61; 156/DIG. 75; 156/DIG. 89; 372/20; 372/41
[58] Field of Search ............................ 372/20, 39, 41; 252/301 F, 301 R; 156/617 SP, 606, DIG. 61, DIG. 75, DIG. 89; 437/247, 949

[56] References Cited

U.S. PATENT DOCUMENTS 4,587,035  5/1986  Kokla ............................ 252/301.4 R
4,711,696  12/1987  Kokta ........................ 156/DIG. 75

Primary Examiner—William L. Sikes
Assistant Examiner—B. R. R. Holloway
Attorney, Agent, or Firm—Morris N. Reinisch

[57] ABSTRACT

The Figure of Merit of titanium-doped sapphire crystal article suitable for use as a tunable laser is enhanced by treating the article at a temperature of about 1750° C. to 2025° C. in an atmosphere containing at least about 20 volume percent hydrogen.

8 Claims, No Drawings

PROCESSES FOR ENHANCING FLUORESCENCE OF TI:A1203 TUNABLE LASER CRYSTALS

This invention was made under Government support under Contract No. N66001-86-C-0051 awarded by the Department of the Navy. The Government has certain rights in this invention.

The present invention relates generally to the field of lasers. More particularly, the present invention is related to a process for improving the lasing efficiency of tunable titanium-doped sapphire, $Ti:Al_2O_3$.

Tunable solid state laser materials have been known to the art since the early 1960's and $Ti:Al_2O_3$ was disclosed by P. F. Moulton (Laser Focus, May 1963) as a tunable laser material having an effective fluorescence tuning range of 750 to 900 nm. The absorption spectra range for $Ti:Al_2O_3$ has been given as extending up to about 650 nm; however, it has been discovered that unless special precautions are taken in the course of processing titanium-doped sapphire, $Ti:Al_2O_3$, the absorption spectra, while reaching a minimum value at about 650 nm, extends over the entire lasing (fluorescence) range with the undesirable result that lasing efficiency of the tunable $Ti:Al_2O_3$ material is significantly reduced.

Moreover, only relatively small amounts of titanium have been found useful in preparing $Ti:Al_2O_3$ material suitable for use as laser crystals. Even at concentrations of titanium of one percent in the melt, crystals prepared by conventional techniques have an absorption of light in the range of 650 to 1100 nm of over 12 percent per centimeter. Often the undesirable absorption peaks at about 850 nm, in the mid-range of the tunable band.

Accordingly, it is desired to improve the lasing efficiency of tunable titanium-doped sapphire lasing material.

One approach to enhancing the lasing efficiency of tunable titanium-doped sapphire lasing material is disclosed in my U.S. Pat. No. 4,711,696, herein incorporated by reference. The disclosed process involves enhancing the fluoresence of titanium-doped sapphire crystal by the process conditions used in the manufacture of the crystal. In general, the process conditions involve providing precursor mixtures for the crystal under a carbon monoxide-containing atmosphere which is being heated toward melt temperatures. Advantageously, the carbon monoxide is present before the mixture is liquified. Often, the carbon monoxide atmosphere is replaced by a hydrogen-containing atmosphere at the melt temperature and during cooling. Carbon monoxide can degrade at the temperature of the melt, i.e., above about 1600° C. to 2050° C. and higher. The foregoing steps are conducted in a non-reactive ambient atmosphere, e.g., nitrogen, argon or other inert gases, with the reducing gas being provided in the ambient gas atmosphere. The non-reactive atmosphere preferably contains about 5 ppm to 1% by volume hydrogen; however greater concentrations of hydrogen may be used, e.g., 5 ppm to 20 volume percent but are usually avoided in view of the safety concerns.

The crystals prepared by the aforementioned technique do have enhanced and desirable fluorescent characteristics. One useful parameter in reporting the fluorescent property of a titanium-doped laser is referred to as the "Figure of Merit". The Figure of Merit is the ratio of the transmission (in percent per centimeter) of a crystal at a wavelength of 830 nanometers (nm) to the transmission (in percent per centimeter) of the crystal at a wavelength of 490 nm. The processes described in my patent application have yielded titanium-doped sapphire crystals having Figures of Merit of 100 or more, and crystals having Figures of Merit of 60 to 80 are facilely produced. While the crystals produced using the aforementioned process are a considerable improvement over those previously available, a need has been evidenced for titanium-doped sapphire laser crystals having even greater Figures of Merit, e.g., 120 and more.

Significant improvements in the Figures of Merit of titanium-doped sapphire crystals using the processes disclosed in my patent application have not proven to be able to be readily obtained. While not wishing to be limited to theory, I believe that the alumina melt used in making the laser crystal presents an equilibrium in which reactive oxygen or reactive oxygen-containing species are present. This reaction oxygen or oxygen-containing species can adversely affect the oxidation state of titanium to produce titanium species that reduce the Figure of Merit. These titanium species are believed to be $Ti^{+3}:Ti^{+4}$ couples. Hence, a practical limit would appear to exist in the Figures of Merit obtainable with titanium-doped sapphire laser crystals.

My U.S. Pat. No. 4,587,035 discloses a vacuum annealling treatment of titanium-doped laser crystals to enhance lasing efficiency.

By this invention, I have provided processes for enhancing the Figure of Merit of titanium-doped sapphire laser crystals and titanium-doped sapphire laser crystals having a Figure of Merit of at least about 120, preferably at least about 200. In accordance with the processes of the invention, a titanium-doped sapphire crystal is maintained at a temperature of at least about 1750° C. to a temperature below which the crystal looses its crystallinity, e.g., a temperature of about 1750° C. to 2025° C., in an atmosphere containing sufficient hydrogen for a time sufficient to increase the Figure of Merit of the crystal.

The crystals provided by the present invention are particularly useful as tunable laser materials having desirable fluorescent characteristics. An aspect of this invention relates to titanium-doped sapphire crystals which exhibit advantageous light transmittance characteristics over the range of 650 nm to 1100 nm. Particularly desirable laser crystals exhibit a light absorption within this range (often measured at 850 nm) (in percent per centimeter) less than 10, frequently less than 8, preferably less than 5, times the square of the weight percent of titanium in the melt for making the crystal. Thus, for a melt containing 1.5 weight percent titanium, this light absorption will be less than $(1.5)^2(10)$, or 22.5 percent per centimeter. Indeed, in processes in accordance with this invention, crystals made using about 1.5 weight percent titanium in the melt provided a light absorbance of about 3 to 4 percent per centimeter.

Titanium-doped sapphire ($Al_2O_3$) crystals are frequently made from a melt containing from about 0.02 to 2.0, often 0.02 to 1.0 atomic percent of titanium. The melt is prepared by heating a mixture of high purity $TiO_2$ (less than 50 ppm of Cr, Fe, Si, Ca) and high purity $Al_2O_3$, e.g., sapphire "crackle" containing less than 100 ppm of impurities such as Si, Cr, Fe and Mg, at a melt temperature in the range of about 2050° C. to 2080° C. A $Ti:Al_2O_3$ crystal can be formed from the melt, e.g., by the well known Czochralski technique and the crystal is cooled to room temperature. In accordance with the process disclosed in my earlier patent application, the crystal can be formed in the presence of a non-reactive ambient atmosphere containing, e.g., about 5 ppm to 1 percent by volume of reducing gas. The reducing gas can be hydrogen; the carbon monoxide used can also be used in accordance with my earlier invention as the reducing gas at temperatures between 800° C. and 1600° C., being replaced by hydrogen for the higher temperature for crystal formation, e.g, 2050° C. The replacement of carbon monoxide at these high temperatures is required to avoid carbon contamination due to decomposition of carbon monoxide.

The processes of this invention may be employed to treat titanium-doped sapphire crystal in any convenient form. For instance, the crystal boule as made from the melt may be treated in accordance with this invention as well as any crystal article obtained therefrom such as the crystal in the form of laser rods. Often, the crystal has as its smallest mean cross-sectional thickness of less than about 10 centimeters, preferably less than 5 centimeters. Larger crystals can be used but the treatment may have to be conducted for longer periods of time.

The crystal article to be treated is heated in a hydrogen-containing atmosphere to a temperature of at least about 1750° C. Although lower temperatures can be used, the rate that the Figure of Merit of the crystal is improved is generally too slow to be commercially feasible. The temperature of the crystal article should not be heated to temperatures at which it begins to become noticeably plastic. Once a melt occurs, the generation of oxygen or oxygen-containing species that adversely affect the titanium oxidation state may result. Hence, the maximum temperature is generally about 2025° C. Increasing the temperature within this range reduces the time required to provide a given improvement in the Figure of Merit. Thus, temperatures of about 1850° C. to 2025° C., say, about 1900° C. to 2000° C., are frequently employed.

The rate of the heating and cooling of the crystal article should be sufficiently slow to avoid inducing undue stress in the article. The rate will therefore depend upon the size and configuration of the article. Usually, the heating and cooling rates are less than 50° C. change per hour.

The amount of hydrogen present in the atmosphere will have an effect on the rate that the Figure of Merit improves. Generally, the hydrogen is present in an amount of at least about 20 percent up to 100 percent by volume of the atmosphere. Most preferably, the hydrogen is present in at least about 40, e.g., 50 to 100, preferably 75 to 100, volume percent of the atmosphere. The atmosphere may contain inert components such as nitrogen or argon. The treatment may be conducted at any convenient pressure from subatmospheric to superatmospheric pressure, e.g., 0.001 to 1000 bar. Preferably, the treatment is at a low superatmospheric pressure due to safety considerations, although high total pressures will favor advantageously higher partial pressures of hydrogen. The pressures may often be from about 0.01 to 10 bar gauge.

The concentration of hydrogen and the partial pressure of hydrogen will affect the rate of improvement of the Figure of Merit. In general, the higher the hydrogen concentration, the faster the rate of improvement. At hydrogen concentrations below about 40 volume percent, the rate of improvement can be unduly slow for commercial operations.

The time of the treatment will depend upon the desired Figure of Merit sought for the crystal as well as the temperature and hydrogen concentrations used. Thus, the treatment may be for as little as one hour to weeks or more. Often, to up-grade a crystal having a tubular shape and a diameter of about 5 centimeters from a Figure of Merit of about 60 to 80 to a Figure of Merit of 120 or more at a temperature of 1900° C. to 2000° C. and a hydrogen concentration of about 50 volume percent, a duration (soak time) of about 20 to 100 hours, e.g., about 40 to 70 hours, is used.

Preferably, the time is sufficient to increase the Figure of Merit by at least about 10 percent, and most preferably, the crystal, after treatment, has a Figure of Merit of at least about 100, say, at least about 120, and most preferably, at least about 150 or 200. At Figures of Merit above 1000, analytical imprecision can often limit any accuracy in determining the Figure of Merit. The processes of this invention can be used with $Ti:Al_2O_3$ crystals having any Figure of merit value, but usually, the crystals have a Figure of merit of at least about 40, preferably at least about 50, prior to treatment.

The processes of this invention provide a convenient means for upgrading the fluorescing efficiency of titanium-doped sapphire crystal. Particularly meritorious features of the processes are its efficacy and the ability to upgrade existing titanium-doped sapphire articles.

The following examples are provided to further illustrate the invention and are not in limitation thereof.

EXAMPLE

Various titanium doped sapphire crystals in the form of cylindrical rods are treated in an annealing furnace. The Figure of Merit of each of the crystals is determined before and after the treatment. Table I further describes the crystals and Table II summarizes the treatment conditions and the Figures of Merit for the crystals.

The crystals exhibit lower laser thresholds after treatment. For instance, the threshold for crystal B is about 42 millijoules prior to treatment and 8.6 millijoules after treatment. Also, the laser output increases. For crystal B, the laser output is about 46.5 milliwatts prior to treatment and 205 milliwatts after treatment. For crystal H, "in grown" bubbles cause internal scattering which inherently reduces Figure of Merit.

TABLE I

| Crystal | Dimensions, cm | | $Ti3+$ Content |
| --- | --- | --- | --- |
| | Diameter | Length | |
| A | 0.61 | 6.8 | 0.05% atomic |
| B | 0.61 | 6.8 | 0.1% atomic |
| C | 0.61 | 5.0 | 0.08% atomic |
| D | 0.61 | 5.0 | 0.14% atomic |
| E | 0.70 | 3.0 | 0.05% atomic |
| F | 1.5 | 8.9 | 0.03% atomic |
| G* | 0.61 | 7.5 | 0.14% atomic |
| H | 0.61 | 7.5 | 0.24% atomic |

*Crystal as grown contained "in grown" bubbles

TABLE II

| Crystal | Atmosphere Ar, Vol. % | H2, Vol % | Pressure, atm. | Heating/Cooling Rate, °C./hr | Soak Time, hr | Soak Temp. °C. | Figure of Merit Before | After |
| --- | --- | --- | --- | --- | --- | --- | --- | --- |
| A | 80 | 20 | 1 | 100 | 43 | 1900 | 28.3 | 100 |
| B | 80 | 20 | 1 | 100 | 43 | 1900 | 9.5 | 156 |
| C | 51 | 49 | 1 | 50 | 40 | 1950 | 20 | 125 |
| D | 51 | 49 | 1 | 50 | 40 | 1950 | 35 | 210 |
| E | 50 | 50 | 1 | 50 | 60 | 1975 | 40 | 159 |
| F | 50 | 50 | 1 | 50 | 100 | 1970 | 20 | 930 |
| G | 50 | 50 | 1 | 50 | 100 | 1970 | 10 | 100 |
| H | 25 | 75 | 1 | 50 | 100 | 1945 | 30 | 227 |

What is claimed is:

1. A method for enhancing a Ti doped $Al_2O_3$ crystal suitable as a laser material comprising maintaining the crystal at a temperature of about 1750° C. to 2025° C. in an inert atmosphere containing sufficient hydrogen for a time sufficient to enhance the Figure of Merit of the crystal.

2. The method of claim 1 wherein hydrogen is present in the atmosphere in an amount of at least about 20 volume percent.

3. The method of claim 1 wherein hydrogen is present in the atmosphere in an amount of at least about 40 volume percent.

4. The method of claim 1 wherein the crystal is maintained at a temperature of about 1850° C. to 2000° C.

5. The method of claim 1 wherein the crystal contains from about 0.02 to 1.0 atomic percent titanium.

6. The method of claim 1 wherein the Figure of Merit of the crystal is improved by at least about 10 percent.

7. The method of claim 1 wherein the Figure of Merit of the crystal is enhanced to at least about 120.

8. A tunable laser crystal of titanium-doped alumina having from about 0.02 to 1.0 atomic percent of titanium and a Figure of Merit of at least about 150.

* * * * *